United States Patent
Chikamatsu et al.

(10) Patent No.: US 10,541,655 B2
(45) Date of Patent: Jan. 21, 2020

(54) WIDEBAND AMPLIFIER AND METHODS OF USE

(71) Applicant: Keysight Technologies, Inc., Santa Rosa, CA (US)

(72) Inventors: Kiyoshi Chikamatsu, Kawasaki (JP); Nobuaki Iwaki, Hino (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/885,190

(22) Filed: Jan. 31, 2018

(65) Prior Publication Data

US 2019/0238099 A1    Aug. 1, 2019

(51) Int. Cl.
*H03F 3/45* (2006.01)
*H03F 1/32* (2006.01)
*H03H 11/34* (2006.01)

(52) U.S. Cl.
CPC ......... *H03F 1/3211* (2013.01); *H03F 1/3252* (2013.01); *H03H 11/34* (2013.01)

(58) Field of Classification Search
CPC ...... H03F 1/3211; H03F 1/3252; H03H 11/34
USPC ........... 330/252–261, 51, 69, 124 R, 295, 84
See application file for complete search history.

(56) References Cited

U.S. PATENT DOCUMENTS

| | | | |
|---|---|---|---|
| 7,088,174 B2 * | 8/2006 | Glass | H03F 3/45475 330/11 |
| 7,161,420 B1 * | 1/2007 | Aram | H03F 1/08 330/107 |
| 7,162,375 B2 | 1/2007 | Van Epps | |
| 7,345,542 B2 | 3/2008 | Dashtestani | |
| 7,619,419 B2 | 11/2009 | Campbell | |
| 9,316,669 B2 | 4/2016 | McTigue | |
| 2014/0320157 A1 | 10/2014 | Brush, IV | |

OTHER PUBLICATIONS

Sandeep Kamath, "Measuring Bluetooth Low Energy Power consumption" AN092, 2012.
Agilent Technologies, "Agilent Technologies 1141A Differential Probe and 1142A Probe Control and Power Module," Jul. 2004.
Linear Technology, "Current Sense Circuit Collection" Application Note 105, Dec. 2005.

* cited by examiner

*Primary Examiner* — Khanh V Nguyen
*Assistant Examiner* — Khiem D Nguyen

(57) ABSTRACT

Generally, in accordance with the various illustrative embodiments disclosed herein, a wideband amplifier includes a direct-current (DC) differential amplifier, an alternating-current (AC) differential amplifier, and a signal combiner circuit. The frequency response of each of the DC differential amplifier and the AC amplifier can be selectively modified by placing the wideband amplifier in one of at least three different operational configurations. The three different operational configurations can be broadly interpreted as a wideband operational configuration, a low-pass operational configuration, and a high-pass operational configuration. The signal combiner circuit operates as a low-pass filter connected to an output terminal of the DC differential amplifier and as a high-pass filter connected to an output terminal of the AC differential amplifier.

19 Claims, 11 Drawing Sheets

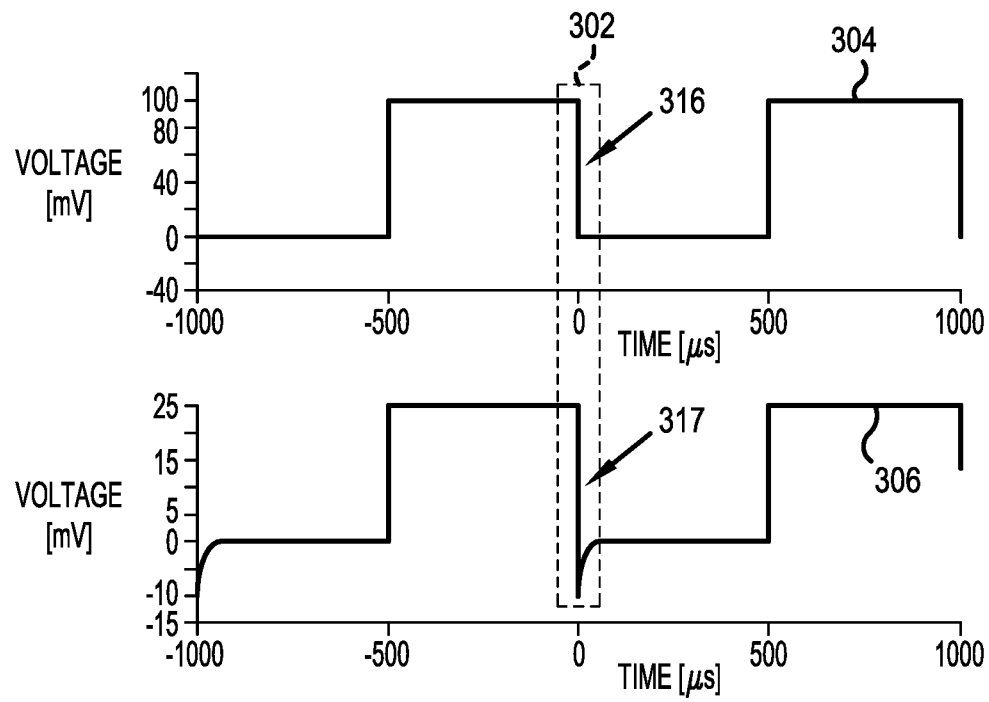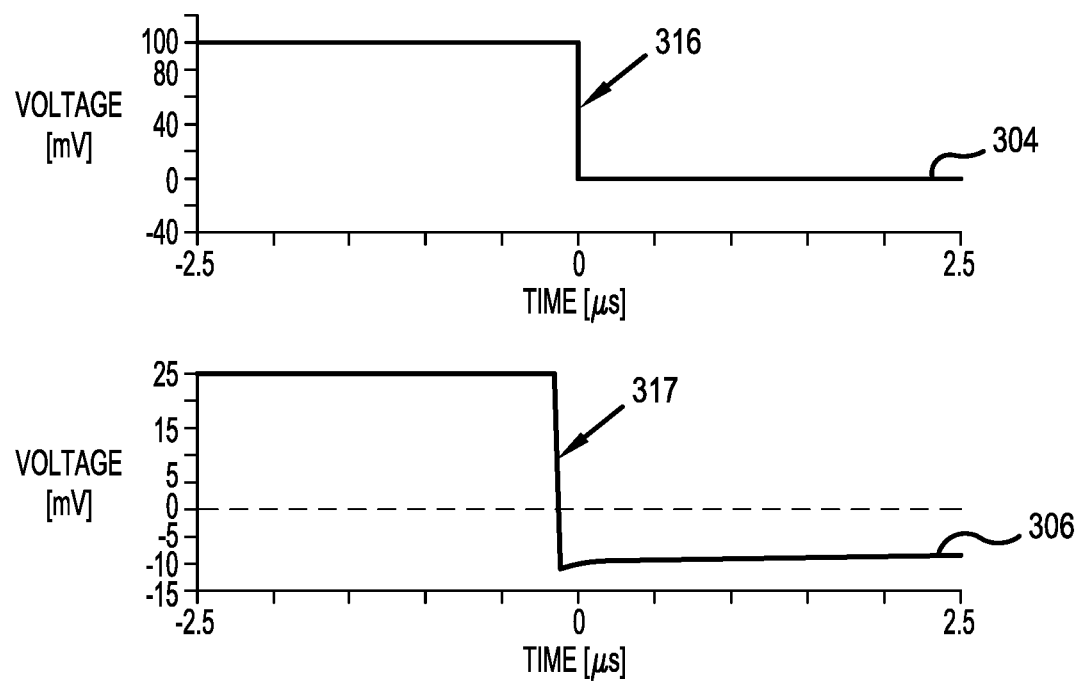

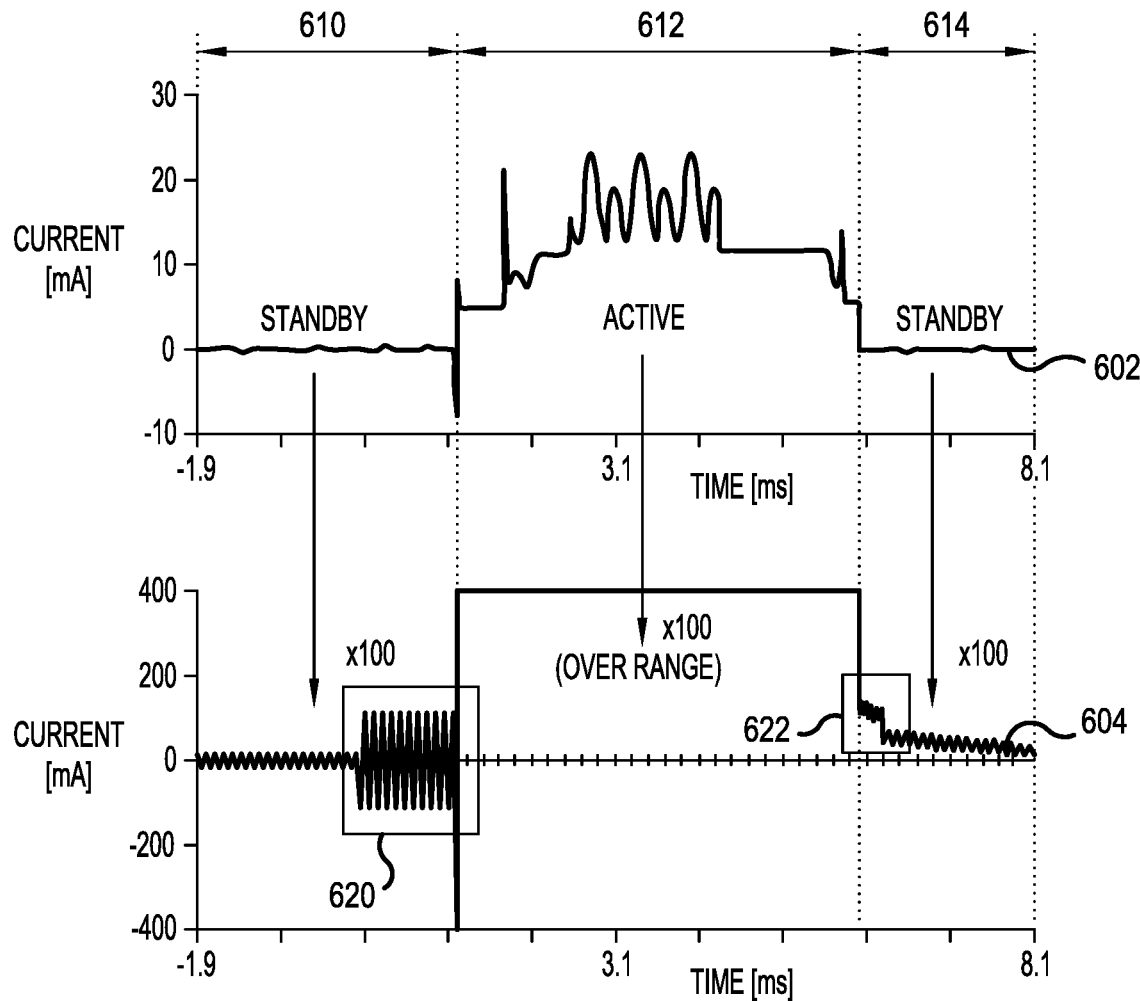
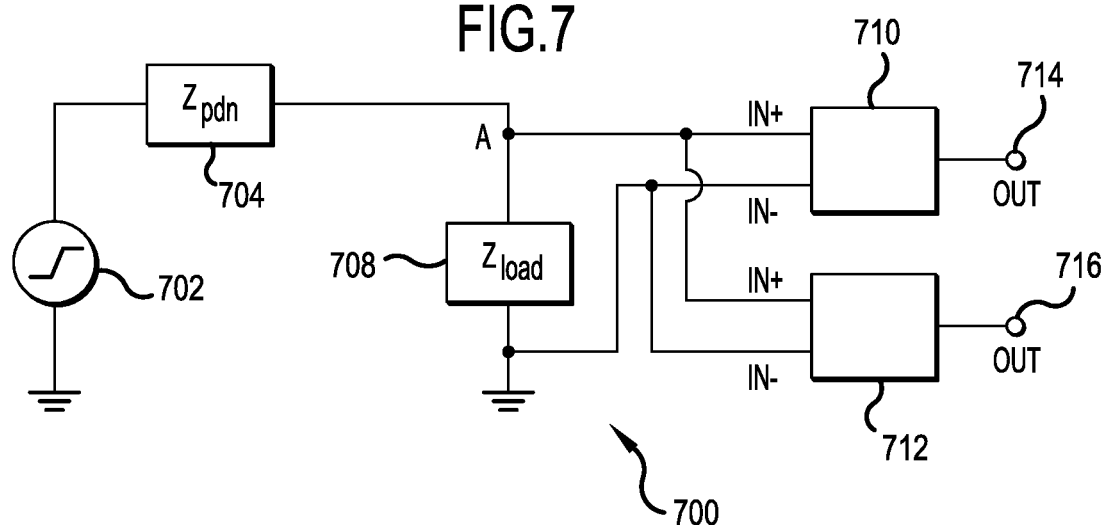

WIDEBAND AMPLIFIER AND METHODS OF USE

BACKGROUND

Wideband amplifiers are ubiquitously used in a wide variety of applications and are often tailored to meet specific requirements such as bandwidth, power handling capacity, and transient response. For example, in signal sensing applications, a wideband amplifier can be used to provide amplification of a low-amplitude signal generated by a sensor. It is generally desirable that the wideband amplifier not only offer signal amplification over a wide bandwidth but also handle large and abrupt variations in signal amplitudes that may occur as a result of transients. However, these two features can be conflicting in nature. As such, in some cases, a wideband amplifier may provide a wide bandwidth response for relatively low amplitude signals but can become overloaded when the signal amplitude goes high (due to a transient voltage spike, for example). The wideband amplifier may also take a certain amount of time to recover from the overload, thus being unable to provide a satisfactory level of performance during the recovery period.

SUMMARY

According to one exemplary embodiment of the disclosure, a wideband amplifier includes a direct-current (DC) differential amplifier, an alternating-current (AC) differential amplifier, and a signal combiner circuit. The DC differential amplifier is configured to provide a first frequency response extending from DC to a first cut-off frequency when the wideband amplifier is placed in a first operational configuration, and extending from DC to a second cut-off frequency that is higher than the first cut-off frequency when the wideband amplifier is placed in a second operational configuration. The AC differential amplifier is configured to provide a second frequency response extending from the first cut-off frequency to a third cut-off frequency when the wideband amplifier is placed in the first operational configuration, and extending from a fourth cut-off frequency that is lower than the first cut-off frequency, to the third cut-off frequency when the wideband amplifier is placed in a third operational configuration. The signal combiner circuit, which is configured to combine a first output signal of the DC differential amplifier and a second output signal of the AC differential amplifier, includes a low-pass filter connected to an output terminal of the DC differential amplifier and a high-pass filter connected to an output terminal of the AC differential amplifier.

According to another exemplary embodiment of the disclosure, a first input node, a second input node, an output node, a direct-current (DC) differential amplifier, an output resistor, an AC differential amplifier, a first series input capacitor, a second series input capacitor, and an output capacitor. The DC differential amplifier has a first input terminal, a second input terminal, and a first output terminal, the first input terminal connected to the first input node of the wideband amplifier, the second input terminal connected to the second input node of the wideband amplifier. The output resistor has a first lead connected to the first output terminal of the DC differential amplifier. The AC differential amplifier has a third input terminal, a fourth input terminal, and a second output terminal. The first series input capacitor has a first lead connected to the first input node of the wideband amplifier and a second lead connected to the third input terminal of the AC differential amplifier. The second series input capacitor has a first lead connected to the second input node of the wideband amplifier and a second lead connected to the fourth input terminal of the AC differential amplifier. The output capacitor has a first lead connected to the second output terminal of the AC differential amplifier.

According to yet another exemplary embodiment of the disclosure, a method includes placing a wideband amplifier in a first operational configuration during a first period of time whereby a DC differential amplifier provides a first frequency response extending from DC to a first cut-off frequency, and an AC differential amplifier provides a second frequency response extending from the first cut-off frequency to a third cut-off frequency; placing the wideband amplifier in a second operational configuration during a second period of time whereby the first frequency response of the DC differential amplifier extends from DC to a second cut-off frequency that is higher than the first cut-off frequency; and placing the wideband amplifier in a third operational configuration during a third period of time whereby the second frequency response of the AC differential amplifier extends from a fourth cut-off frequency that is lower than the first cut-off frequency, to the third cut-off frequency.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

FIG. 3A illustrates a first exemplary input waveform and a first exemplary output waveform of the wideband amplifier when a wideband operational configuration is used in accordance with the disclosure.

FIG. 3B illustrates an expanded view of a transitioning edge in the first exemplary input waveform and a corresponding transitioning edge in the first exemplary output waveform shown in FIG. 3A.

FIG. 6 illustrates some exemplary waveforms associated with the system shown in FIG. 5.

FIG. 7 illustrates an exemplary system that includes a pair of wideband amplifiers configured to evaluate output voltage characteristics of a signal source in accordance with an embodiment of the disclosure.

DETAILED DESCRIPTION

Figure 1:
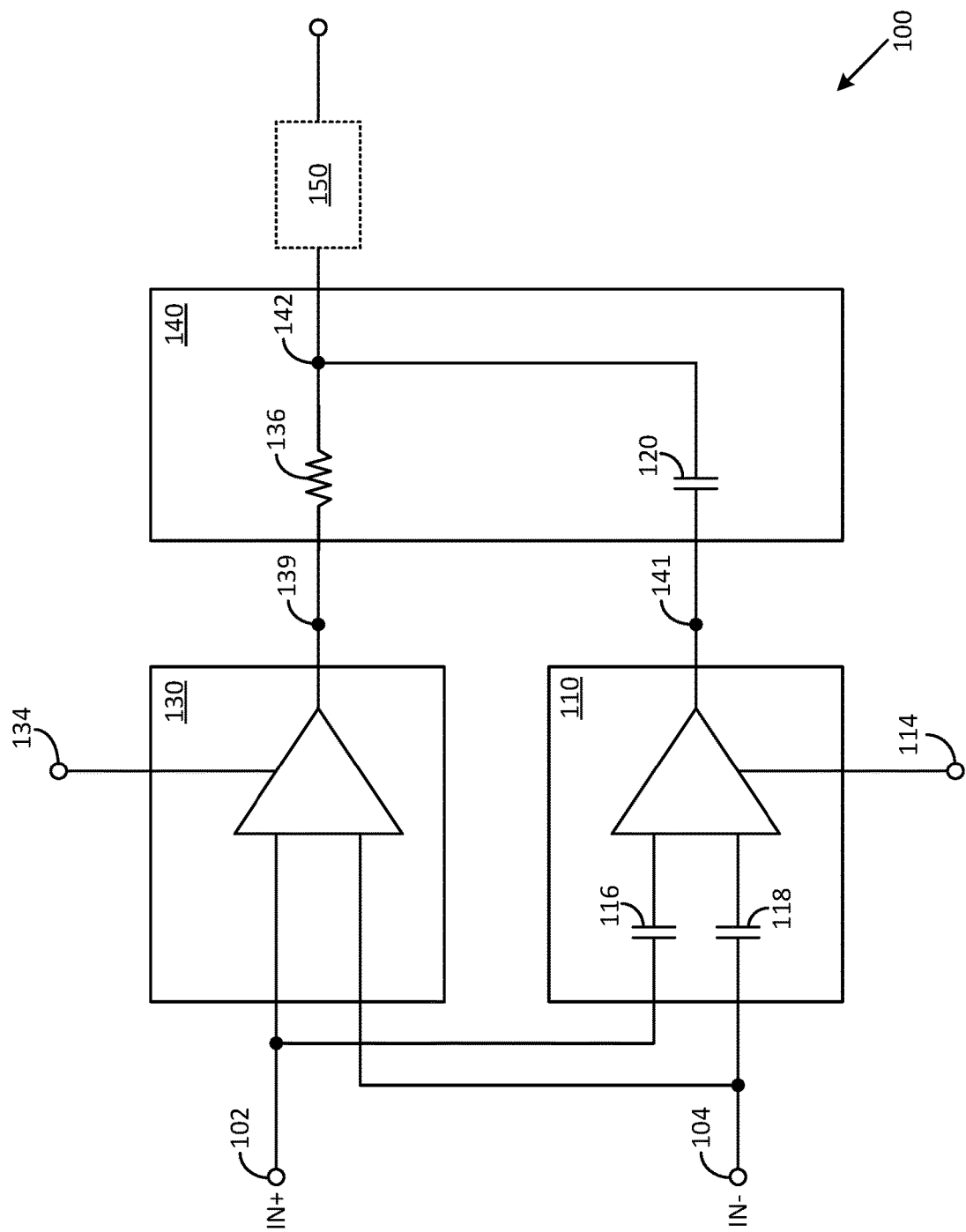
FIG. 1 shows an exemplary wideband amplifier in accordance with a first exemplary embodiment of the disclosure.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the words "terminal," "node," and "lead" as used herein generally pertain to a part of a device that can be used to connect the device to another device or circuit element. In the case of a device such as a resistor, a capacitor, an inductor, or an operational amplifier, any of the words "terminal," "node," and "lead" can indicate for example a wire lead that can be inserted into a hole in a printed circuit board (PCB), a tab that can be soldered onto a pad on a surface of the PCB, or a pad of a surface mount technology (SMT) device that can be soldered onto a pad on a surface of the PCB. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, a wideband amplifier includes a direct-current (DC) differential amplifier, an alternating-current (AC) differential amplifier, and a signal combiner circuit. The frequency response of each of the DC differential amplifier and the AC amplifier can be selectively modified by configuring the wideband amplifier in one of at least three different operational configurations. The three different operational configurations can be broadly interpreted as a wideband operational configuration, a low-pass operational configuration, and a high-pass operational configuration. One or more of the three different operational configurations may be selected in accordance with characteristics of various types of input signals that can be provided to the wideband amplifier. The signal combiner circuit operates as a low-pass filter connected to an output terminal of the DC differential amplifier and as a high-pass filter connected to an output terminal of the AC differential amplifier. One or more switches and/or control terminals provided in the DC differential amplifier and the AC differential amplifier can be used to selectively disable propagating an output signal out of the DC differential amplifier or the AC differential amplifier so as to place the wideband amplifier in one of the three different operational conditions. The switches can be relays or solid-state switches that are activated by using suitable control signals provided by a controller.

FIG. 1 shows a wideband amplifier 100 in accordance with a first exemplary embodiment of the disclosure. In this exemplary embodiment, the wideband amplifier 100 includes a DC differential amplifier 130, an AC differential amplifier 110, and a signal combiner circuit 140. Each of the DC differential amplifier 130 and the AC amplifier 110 has a frequency response that can be selectively modified by configuring the wideband amplifier 100 in one of at least three different operational configurations. The three different operational configurations can be broadly interpreted as a wideband operational configuration, a low-pass operational configuration, and a high-pass operational configuration. The signal combiner circuit 140 is used to combine an output signal of the DC differential amplifier 130 and an output signal of the AC differential amplifier 110, thus allowing the wideband amplifier 100 to offer an overall bandwidth that is a combination of an operational bandwidth of the DC differential amplifier 130 and an operational bandwidth of the AC differential amplifier 110 when the wideband amplifier 100 is placed in the wideband operational configuration.

In the exemplary embodiment shown in FIG. 1, the wideband amplifier 100 includes a first input node 102, a second input node 104, and an output node 142. The first input node 102 and the second input node 104 can be used to couple a differential input signal into the wideband amplifier 100. The differential input signal is DC-coupled into the input terminals of the DC differential amplifier 130 and concurrently AC-coupled into the input terminals of the AC differential amplifier 110.

In one exemplary implementation, the DC coupling of the differential input signal into the DC differential amplifier 130 is carried out by using a pair of electrical conductors (such as a pair of wires or a pair of metal tracks on a printed circuit board) to directly connect the first input node 102 and the second input node 104 to corresponding input terminals of the DC differential amplifier 130. The polarity of the input terminals of the DC differential amplifier 130 can be selected to configure the DC differential amplifier 130 to operate as either a non-inverting differential amplifier or as an inverting differential amplifier.

In another exemplary implementation, a first series resistor is inserted between the first input node 102 and a first input terminal of the DC differential amplifier 130 and a second series resistor is inserted between the second input node 104 and the second input terminal of the DC differential amplifier 130.

The AC coupling of the differential input signal into the AC differential amplifier 110 is carried out by the use of a first series input capacitor 116 between the first input node 102 and a first input terminal of the AC differential amplifier 110 and a second series input capacitor 118 between the second input node 104 and a second input terminal of the AC differential amplifier 110. The capacitance value of each of the first series input capacitor 116 and the second series input capacitor 118 may be selected in accordance with the second operational bandwidth of the AC differential amplifier 110.

The signal combiner circuit 140 includes a low-pass filter connected to an output terminal 139 of the DC differential amplifier 130 and a high-pass filter connected to the output terminal 141 of the AC differential amplifier 110. In the exemplary embodiment shown in FIG. 1, the low-pass filter is implemented in the form of an output resistor 136 that is coupled between the output terminal 139 of the DC differential amplifier 130 and the output node 142 of the wideband amplifier 100. The high-pass filter is implemented in the form of an output capacitor 120 that is coupled between the output terminal 141 of the AC differential amplifier 110 output node 142 of the wideband amplifier 100. More particularly, a first lead of the output resistor 136 is connected to the output terminal 139 of the DC differential amplifier 130 and a second lead of the output resistor 136 is connected to the output node 142 of the wideband amplifier 100. A first lead of the output capacitor 120 is connected to the output terminal 141 of the AC differential amplifier 110 and a second lead of the output capacitor 120 is connected to the output node 142 of the wideband amplifier 100. Additional elements such as an attenuator 150 can be optionally coupled to the output node 142 of the wideband amplifier 100.

The low-pass filter and/or the high-pass filter can be implemented in various alternative ways, such as by using multiple elements such as resistors, inductors, and capacitors placed in a T-filter configuration or a pi-filter configuration, or in the form of a digital filter. When implemented in the form of a digital filter, an analog-to-digital converter can be used to convert one or both of the analog signal outputs of the DC differential amplifier 130 and/or the AC differential amplifier 110 into a digital format that can be propagated through the digital filter.

The DC differential amplifier 130 includes a control terminal 134 for receiving a first control signal provided by a controller (not shown). The controller can include a processor that executes one or more application programs stored in a memory (not shown) for executing various operations of the wideband amplifier 100 in accordance with the disclosure. The control signal is used for placing the DC differential amplifier 130 in a high impedance output condition. When placed in the high impedance output condition, the DC differential amplifier 130 is isolated from the low-pass filter in the signal combiner circuit 140 and the first lead of the output resistor 136 is effectively placed in an open-circuit condition.

The AC differential amplifier 110 includes a second control terminal 114 for receiving another control signal provided by the controller (not shown). The second control signal is used for placing the AC differential amplifier 110 in a high impedance output condition and the first lead of the output capacitor 120 is effectively placed in an open-circuit condition.

Various types of gain-setting components such as a feedback resistor (not shown), can be used to configure the DC differential amplifier 130 to provide a first voltage gain. The AC differential amplifier 110 can be similarly configured to provide a second voltage gain. In one exemplary implementation, the first voltage gain of the DC differential amplifier 130 is set to be substantially equal to the second voltage gain of the AC differential amplifier 110. Consequently, an amplitude of an output signal at the output node 142 of the wideband amplifier 100 is substantially flat from DC to the second cut-off frequency. The DC portion of the output signal is provided by the DC differential amplifier 130 and the second cut-off frequency portion of the output signal is provided by the AC differential amplifier 110.

In another exemplary implementation, the first voltage gain of the DC differential amplifier 130 is set to be different than the second voltage gain of the AC differential amplifier 110. The different voltage gains can be used for example, to compensate for dissimilarities such as signal attenuation and component tolerances in the DC differential amplifier 130 and/or the AC differential amplifier 110.

Figure 2:
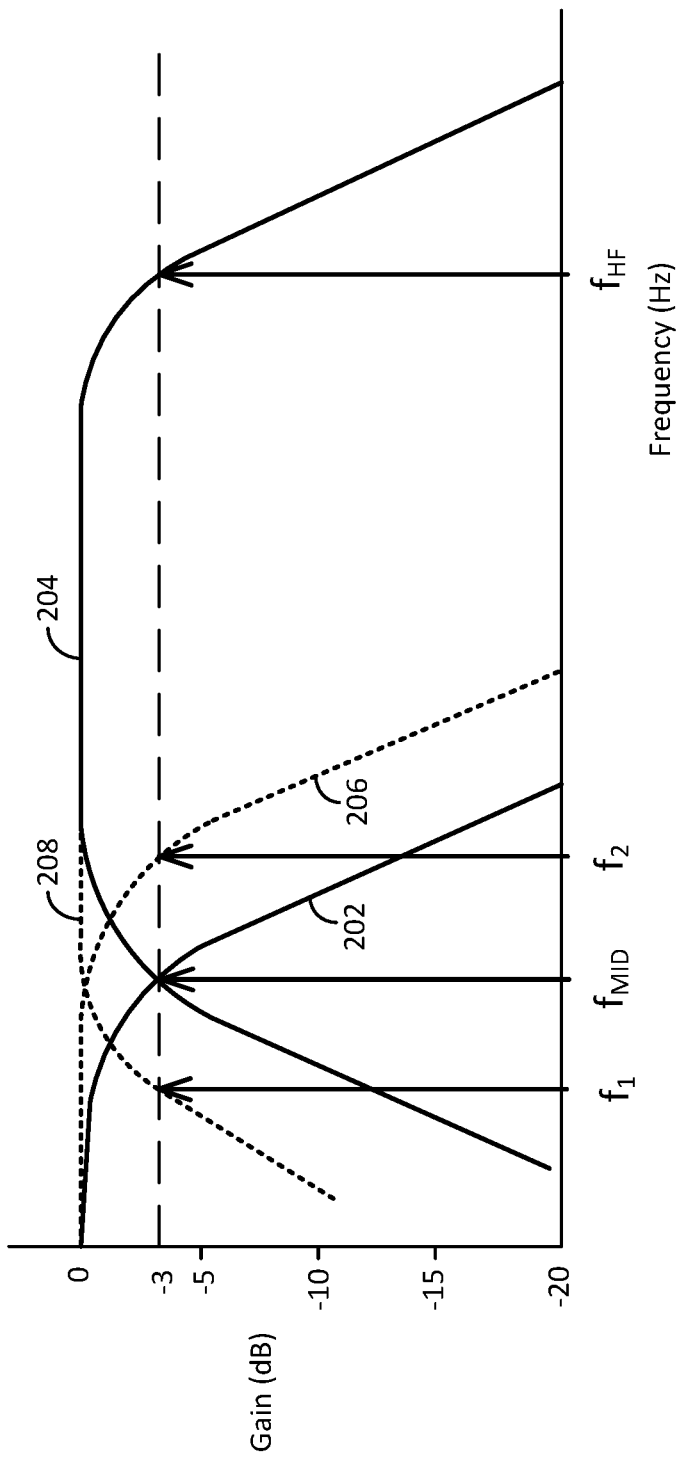
FIG. 2 illustrates exemplary frequency response characteristics of the wideband amplifier shown in FIG. 1.

FIG. 2 illustrates an exemplary frequency response of the wideband amplifier 100 as observed at the output node 142 of the wideband amplifier 100. It should be understood that the various cut-off frequencies referred to below are 3-dB cut-off frequencies.

The graph 202 represents a frequency response of the DC differential amplifier 130 and the graph 204 represents a frequency response of the AC differential amplifier 110 during a first period of time when neither the DC differential amplifier 130 nor the AC differential amplifier 110 has been placed in a high impedance output condition. Under this condition, which corresponds to the wideband operational configuration of the wideband amplifier 100, the signal combiner circuit 140 includes both the low-pass filter and the high-pass filter and provides a frequency response extending from DC to an upper cut-off frequency ($f_{HF}$) in accordance with the disclosure.

Graph 202 extends from DC to an upper cut-off frequency ($f_{MID}$) when the wideband amplifier 100 is placed in the wideband operational configuration. Graph 204 extends from a lower cut-off frequency that is above DC (in this example, the lower cut-off frequency corresponds to $f_{MID}$) to the upper cut-off frequency ($f_{HF}$) when the wideband amplifier 100 is placed in the wideband operational configuration. The frequency $f_{MID}$ can be defined as $f_{MID}=1/(2*\pi*R*C)$ where "R" is the resistance value of output resistor 136 and "C" is the capacitance value of the output capacitor 120.

The graph 206 represents a frequency response of the DC differential amplifier 130 during a second period of time when the DC differential amplifier 130 is operational and the AC differential amplifier 110 has been placed in a high impedance output condition. Under this condition, which corresponds to the low-pass operational configuration of the wideband amplifier 100, the signal combiner circuit 140 includes only the low-pass filter. The frequency response of the DC differential amplifier 130 now extends from DC to an upper cut-off frequency ($f_2$) in accordance with the disclosure. The upper cut-off frequency ($f_2$) has shifted upwards from the upper cut-off frequency ($f_{MID}$) that is applicable when the wideband amplifier 100 is in the wideband operational configuration, thereby providing for a larger low-pass operational bandwidth. The upwards shift occurs as a result of removal of loading by the AC differential amplifier 110 upon the output terminal 139 of the DC differential amplifier 130. In one exemplary implementation, the AC differential amplifier 110 can be placed in the high impedance output condition by providing the second control signal to the control terminal 114 of the AC differential amplifier 110, whereby the first lead of the output capacitor 120 that is connected to the output terminal 141 of the AC differential amplifier 110 is effectively in an open-circuit condition.

The graph 208 represents a frequency response of the AC differential amplifier 110 during a third period of time when the AC differential amplifier 110 is operational and the DC differential amplifier 130 has been placed in a high impedance output condition. Under this condition, which corresponds to the high-pass operational configuration of the wideband amplifier 100, the signal combiner circuit 140 includes only the high-pass filter. The frequency response of the AC differential amplifier 110 now extends from the upper cut-off frequency ($f_{HF}$) to a lower cut-off frequency ($f_1$) that is lower than the lower cut-off frequency ($f_{MID}$) that is applicable when the wideband amplifier 100 is in the wideband operational configuration, thereby providing for a larger high-pass operational bandwidth. The downwards shift occurs as a result of removal of loading by the DC differential amplifier 130 upon the output terminal 141 of the AC differential amplifier 110. In one exemplary implementation, the DC differential amplifier 130 can be placed in the high impedance output condition by providing the first control signal to the control terminal 134 of the DC differential amplifier 130, whereby the first lead of the output resistor 136 that is connected to the output terminal 139 of the DC differential amplifier 130 is effectively in an open-circuit condition.

FIG. 3A illustrates a first exemplary input waveform 304 and a first exemplary output waveform 306 of the wideband amplifier 100 during the wideband operational configuration in accordance with the disclosure. The first exemplary input waveform 304 corresponds to an input signal coupled into the first input node 102 and the second input node 104 of the wideband amplifier 100. In this example, the input signal has a frequency of 1 kHz and a voltage amplitude swing ranging from 0V to 100 mV. The gain of the DC differential amplifier 130 is set equal to the gain of the AC differential amplifier 110 (for example, a gain of 20).

A falling edge 316 of the input waveform 304 and a corresponding falling edge 317 of the output waveform 306 are included in a box 302 that is shown in a dashed-line format. An undershoot of about 10 mV occurs in the falling edge 317 of the output waveform 306 with an undesirable amount of recovery time (about 50 μsec) for the output waveform 306 to reach 0V in correspondence with the input waveform 304 that has reached 0V with substantially no delay. The undershoot in the falling edge 317 of the output waveform 306 is attributable to the wideband amplifier 100 having an overdrive condition as a result of the amplitude and/or edge-transitioning characteristics of the first exemplary input waveform 304.

FIG. 3B shows an expanded view of the waveform edges that are included in box 302 shown in FIG. 3A. As a result of the undesirable amount of recovery time, the amplitude of the output waveform 306 remains about 8 mV below 0V level as far out as about 2.5 μS after the occurrence of the falling edge 317.

Furthermore, when a waveform observation is carried out by using an oscilloscope for example, the falling edge 317 of the output waveform 306 can erroneously appear to precede the falling edge 316 of the input waveform 304. This is caused due to a saturation condition in both of the DC differential amplifier 130 and the AC differential amplifier 110 when the input waveform is at 100 mV (or greater) prior to the occurrence of the falling edge 316 of the input waveform 304. The saturation condition leads to a distortion of the output waveform 306 in the form of the falling edge 317 of the output waveform 306 erroneously appearing to precede the falling edge 316 of the input waveform 304.

This undesirable condition can be addressed in accordance with the disclosure, by providing the second control signal to the control terminal 114 for placing the AC differential amplifier 110 in the high impedance output condition. Consequently, the first lead of the output capacitor 120 is in an open-circuit condition and the signal combiner circuit 140 operates in the low-pass operational configuration in accordance with the disclosure. The frequency response of the wideband amplifier 100 changes from the graph 202 to the graph 206 (shown in FIG. 2).

Figure 4A:
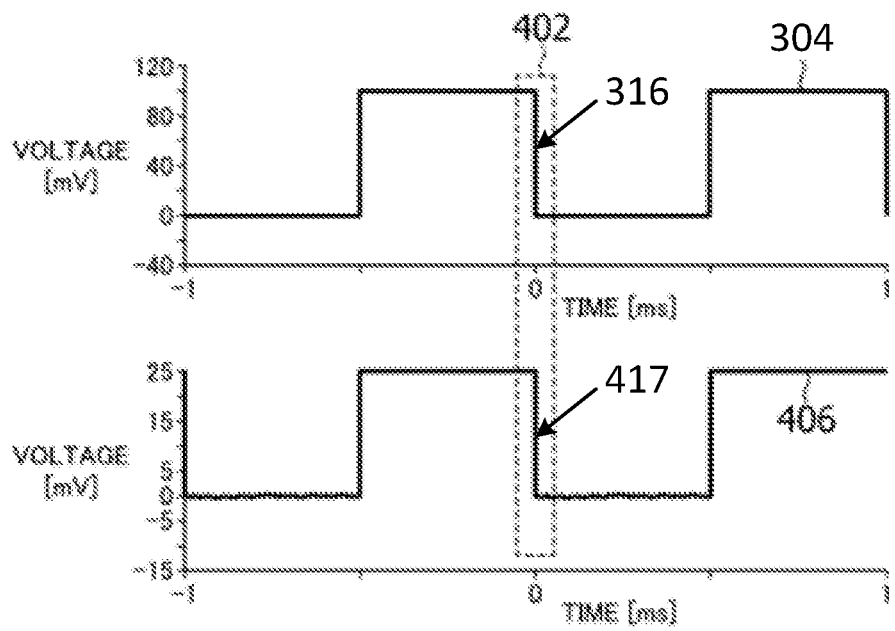
FIG. 4A illustrates the first exemplary input waveform and a second exemplary output waveform of the wideband amplifier when a low-pass operational configuration is used in accordance with the disclosure.

FIG. 4A illustrates the first exemplary input waveform 304 (shown in FIG. 3A) and a second exemplary output waveform 406 of the wideband amplifier when the wideband amplifier 100 is placed in the low-pass operational configuration. The amount of undershoot that was present in the falling edge 317 of the first exemplary output waveform 306 (shown in FIG. 3A) is now reduced due to the low-pass operational configuration. The reduction in undershoot is shown in the falling edge 417 of the second exemplary output waveform 406.

Figure 4B:
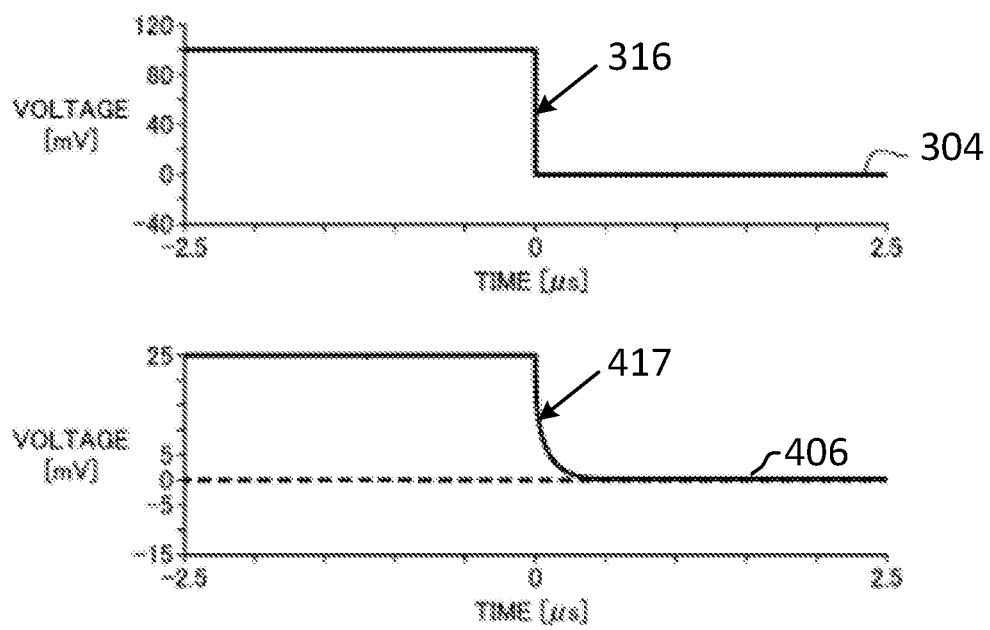
FIG. 4B illustrates an expanded view of the transitioning edge in the first exemplary input waveform and a corresponding transitioning edge in the second exemplary output waveform shown in FIG. 4A.

FIG. 4B shows an expanded view of the waveform edges that are included in box 402 shown in FIG. 4A. The recovery time associated with the undershoot in the falling edge 417 of the second exemplary output waveform 406 is about 500 nsec in comparison to the recovery time of about 50 μsec that is associated with the undershoot in the falling edge 317 of the first exemplary output waveform 306.

Furthermore, the falling edge 417 of the output waveform 406 has a rational timing relationship with respect the falling edge 316 of the input waveform 304 when the waveforms are observed and/or evaluated in a test instrument. Thus, configuring the signal combiner circuit 140 to operate in the low-pass operational configuration provides for a fast-recovery mode of operation that mitigates at least some adverse effects associated with an overdrive condition.

Figure 5:
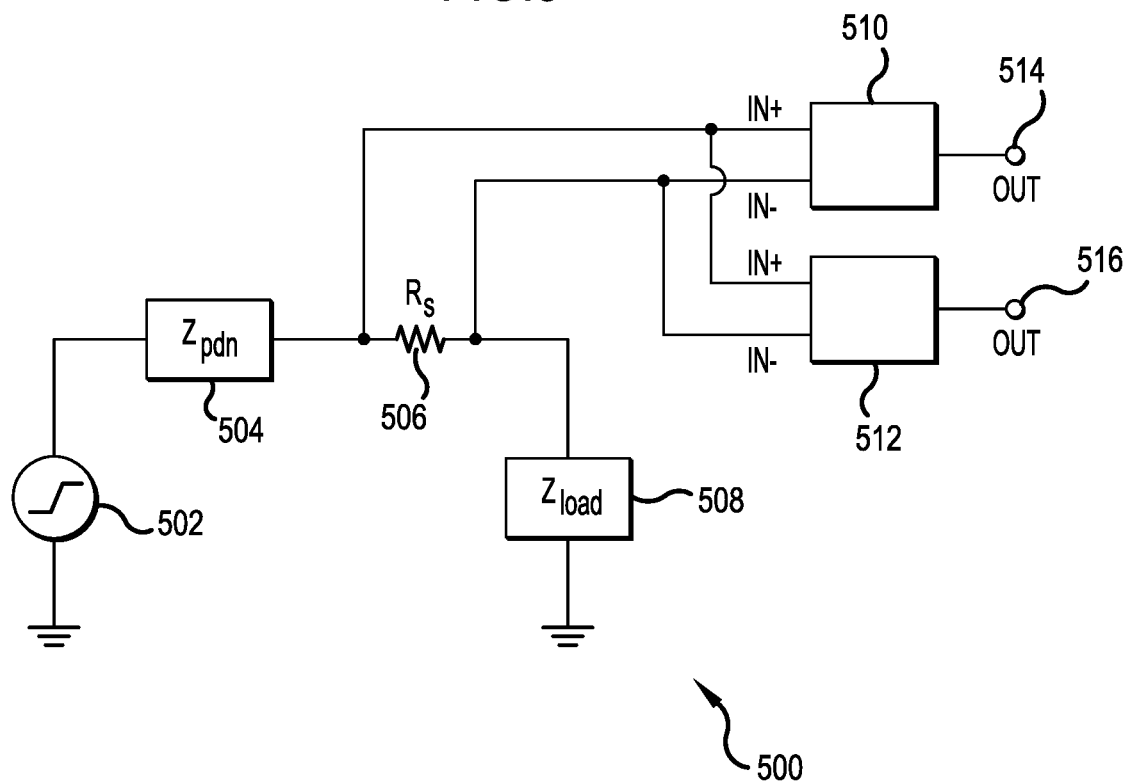
FIG. 5 illustrates an exemplary system that includes a pair of wideband amplifiers configured to evaluate output current characteristics of a signal source in accordance with an embodiment of the disclosure.

FIG. 5 illustrates an exemplary system 500 that includes a first wideband amplifier 510 and a second wideband amplifier 512 configured to evaluate output current characteristics of a signal source 502 in accordance with an embodiment of the disclosure. The signal source 502 is connected via an electrical conductor (such as a wire or a cable) to a first lead of a resistor 506. The resistor 506 operates as an exemplary current sensing element. The electrical conductor is schematically depicted as a first impedance element 504. A second lead of the resistor 506 is connected to a load element that is schematically depicted as a second impedance element 508.

In a first exemplary implementation, the first wideband amplifier 510 is a conventional wideband amplifier that is different than the wideband amplifier 100 described herein. In a second exemplary implementation, the first wideband amplifier 510 is the wideband amplifier 100 described herein. In both of the first exemplary implementation and the second exemplary implementation, the second wideband amplifier 512 is the wideband amplifier 100 described herein.

A first input node of the first wideband amplifier 510 is connected to a first input node of the second wideband amplifier 512, as well as to the first lead of the resistor 506. A second input node of the first wideband amplifier 510 is connected to a second input node of the second wideband amplifier 512, as well as to the second lead of the resistor 506. Consequently, a voltage drop across the resistor 506, which is indicative of an amplitude of current provided by the signal source 502, is coupled into each of the first wideband amplifier 510 and the second wideband amplifier 512. A test instrument (not shown) such as an oscilloscope or a waveform analyzer, can be connected to the output node 514 of the first wideband amplifier 510 and/or to the output node 516 of the second wideband amplifier 512.

In the exemplary system 500, the voltage gain of the second wideband amplifier 512 is set higher than the voltage gain of the first wideband amplifier 510. For example, the first wideband amplifier 510 can be set to a first voltage gain suitable for observing voltages corresponding to a current flow ranging from about 40 μA to about 200 mA through the resistor 506 and the second wideband amplifier 512 can be set to a second voltage gain that is higher than the first voltage gain and suitable for observing voltages corresponding to a current flow ranging from about 320 nA to about 2 mA through the resistor 506.

In a first exemplary implementation, the first wideband amplifier 510 as well as the second wideband amplifier 512 are placed in the low-pass operational configuration in accordance with the disclosure. In a second exemplary implementation, the first wideband amplifier 510, which can be either a conventional wideband amplifier or the wideband amplifier 100, is left to operate in a default wideband mode of operation and only the second wideband amplifier 512 is placed in the low-pass operational configuration in accordance with the disclosure.

FIG. 6 illustrates an exemplary waveform 602 that is observable at the output node 514 of the first wideband amplifier 510 (shown in FIG. 5) and an exemplary waveform 604 that is observable at the output node 516 of the second wideband amplifier 512 (shown in FIG. 5). In this example, waveform 602 appears to indicate no current propagation through the resistor 506 during a first period 610, followed by current propagation during a second period 612, and no current propagation during a third period 614. This current propagation characteristic corresponds to an off-on-off characteristic of a signal generated by the signal source 502.

The first voltage gain of the first wideband amplifier 510, which is lower than the second voltage gain of the second wideband amplifier 512, provides for an overall view of the signal provided by the signal source 502, while the second voltage gain of the second wideband amplifier 512 provides for a close-up view of certain portions of the signal provided by the signal source 502. More particularly, the overall view provided by waveform 602 indicates large amplitude voltage fluctuations during the second period 612 but fails to provide enough resolution to observe small amplitude voltage fluctuations that occur during the first period 610 and the third period 614.

The waveform 604 shows the small amplitude current fluctuations that occur during the first period 610 and the third period 614 with a greater resolution due to the second voltage gain of the second wideband amplifier 512. In this example, the small amplitude current fluctuations that occur during the first period 610 are indicated by a box 620 with the voltage gain of the second wideband amplifier 512 set to 100 times the voltage gain of the first wideband amplifier 510. The small amplitude current fluctuations that occur during the third period 614 are indicated by a box 622.

The large amplitude current fluctuations during the second period 612 is manifested as an overdrive condition in the waveform 604 during the second period 612. The low-pass operational configuration of the second wideband amplifier 512 counters the overdrive condition in the manner described above with reference to FIGS. 4A and 4B.

Accordingly, waveform 604 can be used to observe characteristics of the signal provided by the signal source 502 during the first period 610 and the third period 614 while ignoring the second period 612. The waveform 602 can be used to observe characteristics of the signal provided by the signal source 502 during the second period 612, thereby complementing the observations made using the waveform 604.

The system 500 thus provides for evaluating large amplitude voltage fluctuations in some parts of the signal provided by the signal source 502 while concurrently allowing evaluation of small amplitude voltage fluctuations in some other parts of the signal provided by the signal source 502. The large amplitude voltage fluctuations can be evaluated with a first degree of resolution and the small amplitude voltage fluctuations can be evaluated with a second degree of resolution that is independent of the first degree of resolution, thereby providing a wide dynamic range for evaluating various characteristics of the signal provided by the signal source 502.

FIG. 7 illustrates an exemplary system 700 that includes a first wideband amplifier 710 and a second wideband amplifier 712 configured to evaluate output voltage characteristics of a signal source 702 in accordance with an embodiment of the disclosure. The signal source 702 is connected via an electrical conductor (schematically depicted as a first impedance element 704) to a load element (schematically depicted as a second impedance element 708).

In a first exemplary implementation, the first wideband amplifier 710 is a conventional wideband amplifier that is different than the wideband amplifier 100 described herein and the second wideband amplifier 712 is the wideband amplifier 100 described herein. In a second exemplary implementation, both of the first wideband amplifier 710 and the second wideband amplifier 712 is the wideband amplifier 100 described herein.

A first input node of the first wideband amplifier 710 is connected to a first input node of the second wideband amplifier 712, as well as to a first terminal of the load element 708. A second input node of the first wideband amplifier 710 is connected to a second input node of the second wideband amplifier 712, as well as to a second terminal of the load element 708. The second terminal of the load element is connected to ground. This arrangement allows for a voltage potential developed across the load element 708 to be coupled into each of the first wideband amplifier 710 and the second wideband amplifier 712. A test instrument (not shown) such as an oscilloscope or a waveform analyzer, can be connected to the output node 714 of the first wideband amplifier 710 and/or to the output node 716 of the second wideband amplifier 712.

In the exemplary system 700, the second wideband amplifier 712 has a voltage gain that is set higher than the voltage gain of the first wideband amplifier 710. In a first exemplary implementation, both the first wideband amplifier 710 and the second wideband amplifier 712 are placed in the high-pass operational configuration. In a second exemplary implementation, only the second wideband amplifier 712 is placed in the high-pass operational configuration and the first wideband amplifier 710, which can be either a conventional wideband amplifier or the wideband amplifier 100, is left to operate in a default wideband mode of operation.

Figure 8:
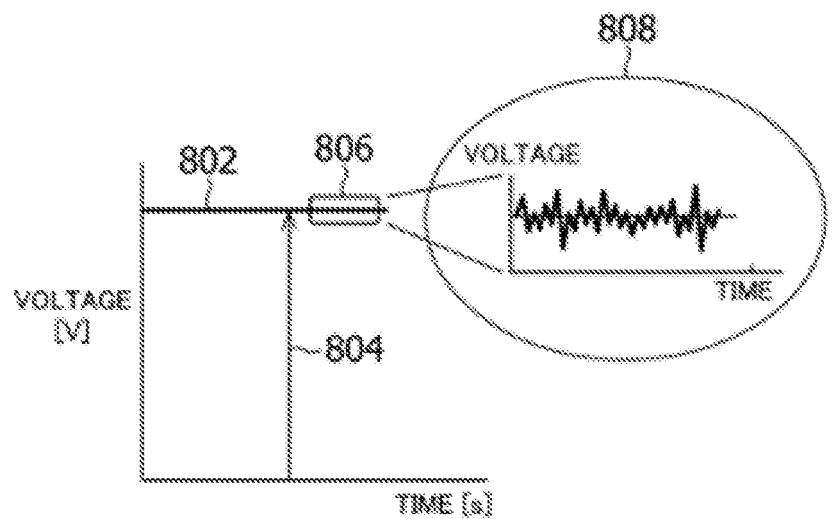
FIG. 8 illustrates a first exemplary waveform associated with the system shown in FIG. 7.

FIG. 8 illustrates an exemplary waveform 802 that is observable at the output node 714 of the first wideband amplifier 710. The waveform 802 has a large amplitude DC component 804 and a small amplitude AC component 806 riding upon the DC component 804. A section of the small amplitude AC component 806 is shown in magnified form inside an oval 808 for purposes of illustration. The difference in amplitudes between the DC component 804 and the AC component 806 prevents evaluation of the DC component 804 concurrently with the AC component 806 in a conventional test instrument such as an oscilloscope. Typically, DC input coupling is used in the conventional oscilloscope for evaluating the DC component 804 and AC input coupling used for evaluating the AC component 806. When DC input coupling is used, the resolution required for evaluating the DC component 804 may be inappropriate for concurrently evaluating the AC component 806. When AC input coupling is used, the AC component 806 can be evaluated by using a suitable resolution but the DC component 804 is blocked and cannot be observed in the oscilloscope.

In contrast, the system 700 allows observation of the DC component 804 with a first degree of resolution and concurrently observe the AC component 806 with a second degree of resolution that is independent of the first degree of resolution, thereby providing a wide dynamic range for evaluating both AC and DC characteristics of the signal provided by the signal source 702. More particularly, the DC component 804 can be observed at the output node 714 of the first wideband amplifier 710 and the AC component 806 can be observed at the output node 716 of the second wideband amplifier 712.

The first voltage gain of the first wideband amplifier 710 can be set in accordance with an expected range of fluctuations in the waveform 802.

Figure 9:
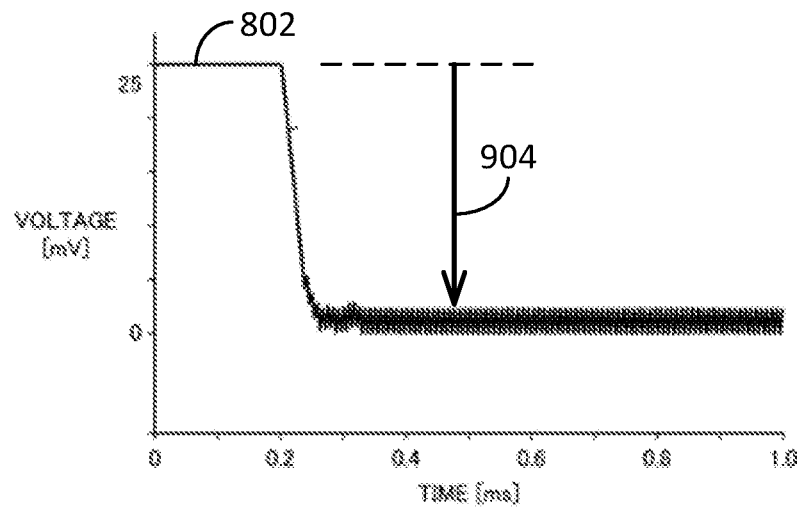
FIG. 9 illustrates a second exemplary waveform associated with the system shown in FIG. 7.

FIG. 9 illustrates the waveform 802 undergoing a significant change in amplitude in the DC component 804. The amplitude change 904 can be observed at the output node 714 of the first wideband amplifier 710 even though changes in the AC component 806 may or may not be observable at the output node 714. The changes in the AC component 806 can however be observed at the output node 716 of the second wideband amplifier 712. The second voltage gain of the second wideband amplifier 712 coupled with the greater bandwidth offered by the high-pass operational configuration allows for observation of the in the AC component 806 with high resolution and accuracy.

Figure 10:
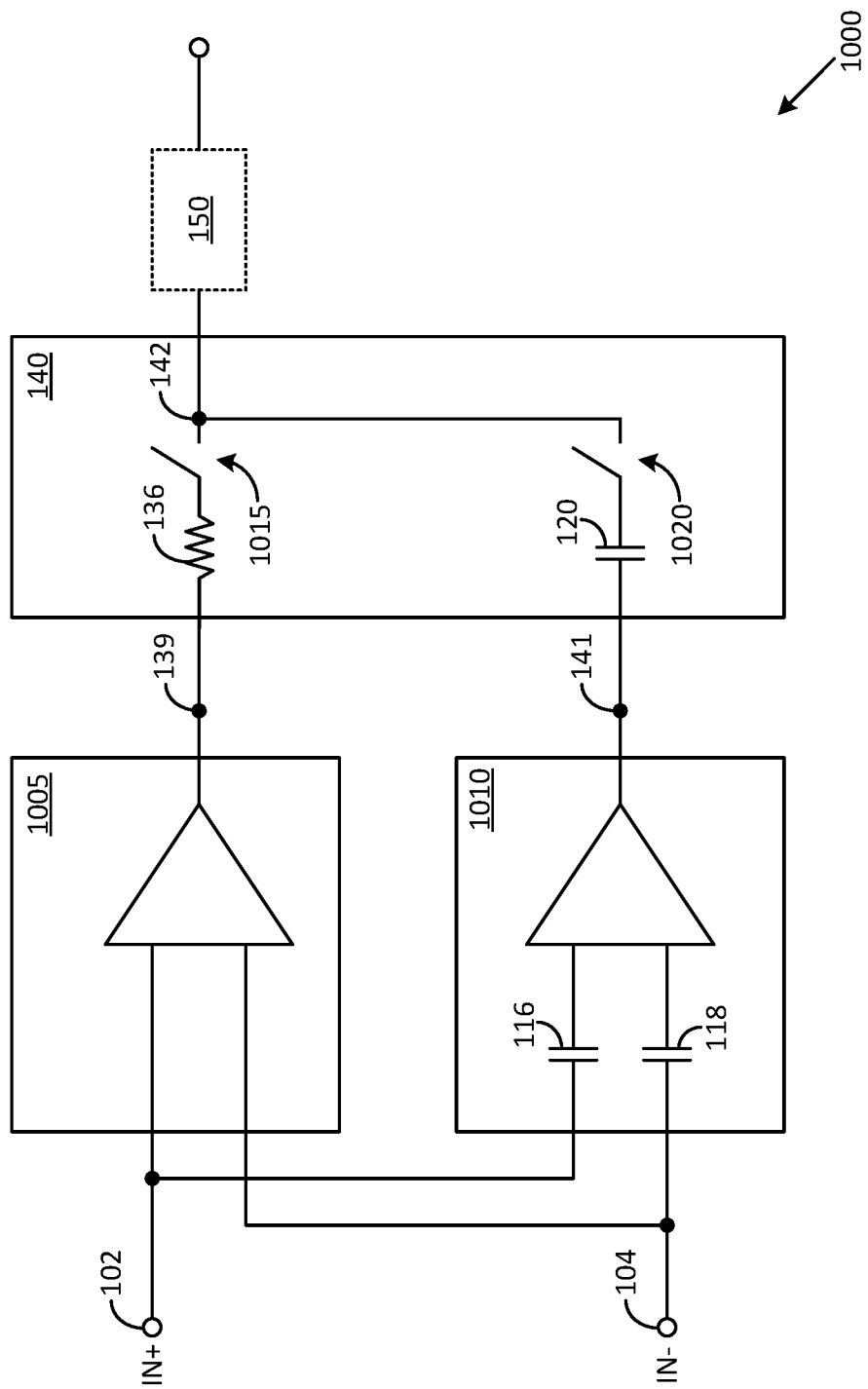
FIG. 10 shows an exemplary wideband amplifier in accordance with a second exemplary embodiment of the disclosure.

FIG. 10 shows an exemplary wideband amplifier 1000 in accordance with a second exemplary embodiment of the disclosure. The wideband amplifier 1000 includes a DC differential amplifier 1005, an AC differential amplifier 1010, and the signal combiner circuit 140. In this second exemplary embodiment, the DC differential amplifier 1005 does not include a first control terminal that can be used to place the DC differential amplifier 130 in a high impedance output condition. The AC differential amplifier 1010 also does not include a second control terminal that can be used to place the AC differential amplifier 1010 in a high impedance output condition.

However, in a first exemplary implementation, a first switch 1015 is provided between the output resistor 136 and the output node 142 of the wideband amplifier 1000, and a second switch 1020 is provided between the output capacitor 120 and the output node 142 of the wideband amplifier 1000.

In a second exemplary implementation, the first switch 1015 is provided between the output terminal 139 of the DC differential amplifier 1005 and the output resistor 136, and the second switch 1020 is provided between the output terminal 141 of the AC differential amplifier 1010 and the output capacitor 120.

In both the first exemplary implementation and the second exemplary implementation, the wideband amplifier 1000 can be placed in the wideband operational configuration in accordance with the disclosure by closing each of the first switch 1015 and the second switch 1020. The second lead of the output resistor 136 is connected to the output node 142 due to the closing of the first switch 1015 and the second lead of the output capacitor 120 is connected to the output node 142 due to closing of the second switch 1020.

The wideband amplifier 1000 can be placed in the low-pass operational configuration in accordance with the disclosure by closing the first switch 1015 and opening the second switch 1020. The second lead of the output resistor 136 is connected to the output node 142 due to the closing of the first switch 1015 and the second lead of the output capacitor 120 is disconnected from the output node 142 due to the opening of the second switch 1020.

The wideband amplifier 1000 can be placed in the high-pass operational configuration in accordance with the disclosure by opening the first switch 1015 and closing the second switch 1020. The second lead of the output resistor 136 is disconnected from the output node 142 due to the opening of the first switch 1015 and the second lead of the output capacitor 120 is connected to the output node 142 due to the closing of the second switch 1020.

Figure 11:
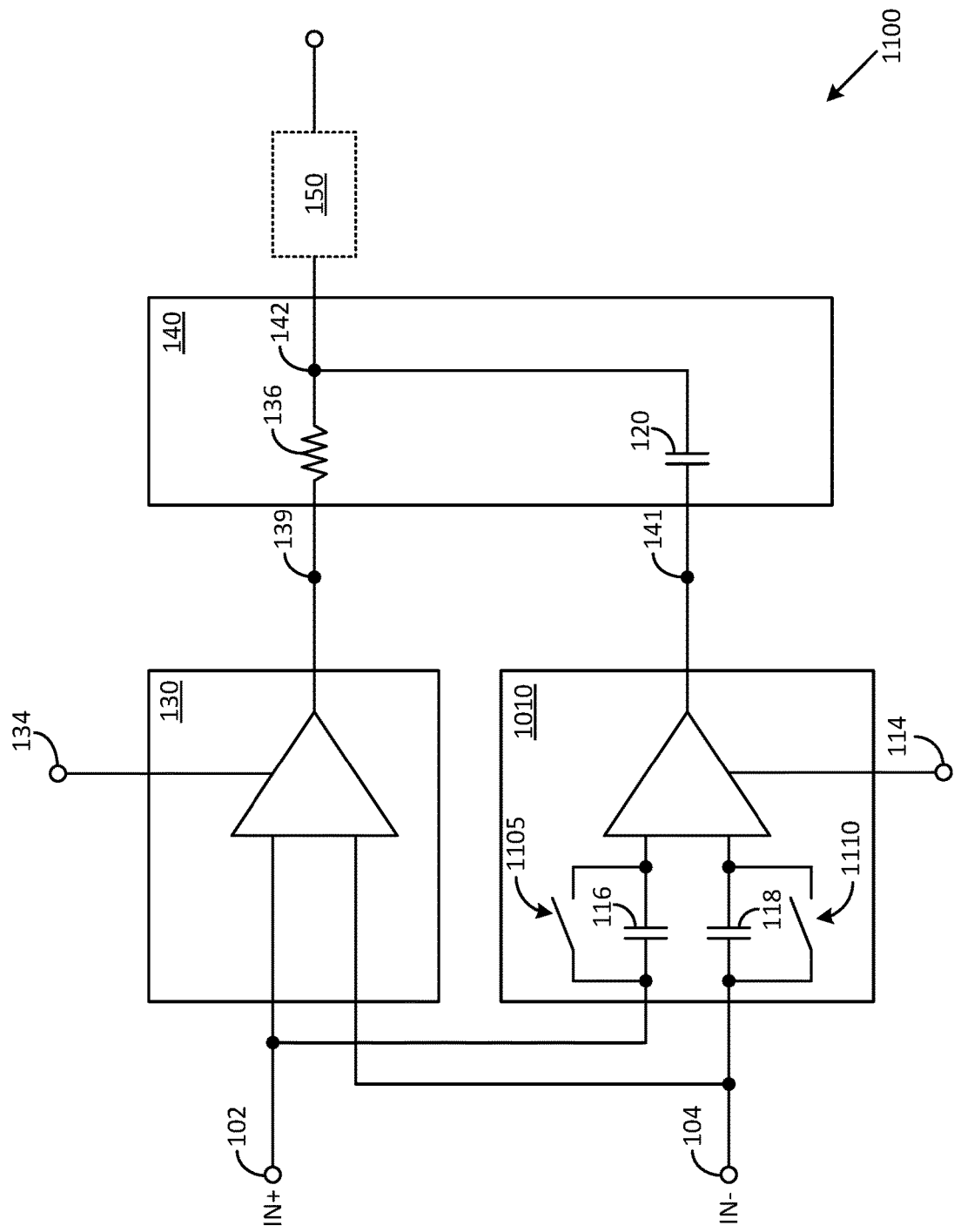
FIG. 11 shows an exemplary wideband amplifier in accordance with a third exemplary embodiment of the disclosure.

FIG. 11 shows an exemplary wideband amplifier 1100 in accordance with a third exemplary embodiment of the disclosure. The wideband amplifier 1100 includes the DC differential amplifier 130, an AC differential amplifier 1010, and the signal combiner circuit 140. In this second exemplary embodiment, the DC differential amplifier 130 is identical to the DC differential amplifier 130 that is a part of the wideband amplifier 100 described above with reference to FIG. 1. The AC differential amplifier 1010 is substantially similar to the AC differential amplifier 110 that is a part of the wideband amplifier 100 described above with reference to FIG. 1. However, the AC differential amplifier 1010 includes two components that are not included in the AC differential amplifier 110. These two components are a first input switch 1105 that is connected across the first series input capacitor 116 and a second input switch 1110 that is connected across the second series input capacitor 118.

The wideband amplifier 1100 can be placed in a first wideband operational configuration in accordance with the disclosure when the input signal has a DC component with an AC component superimposed upon the DC component. Each of the first input switch 1105 and the second input switch 1110 is opened to place the wideband amplifier 1100 in the first wideband operational configuration. The AC differential amplifier 1010 operates as an AC amplifier that blocks the DC component of the input signal and allows evaluation of the AC component of the input signal with greater resolution than that provided by the DC differential amplifier 130 that can be used to evaluate the DC component of the input signal. The control terminal 134 and/or the control terminal 114 can be used for addressing an overdrive condition when present in the input signal.

The wideband amplifier 1100 can be placed in a second wideband operational configuration in accordance with the disclosure when one or more characteristics of the input signal indicate that the input signal has an AC component but does not include a substantial DC component. The occurrence of an overdrive condition is minimized or eliminated due to the DC component not being present in the input signal. Each of the first input switch 1105 and the second input switch 1110 is closed to place the wideband amplifier 1100 in the second wideband operational configuration.

Figure 12:
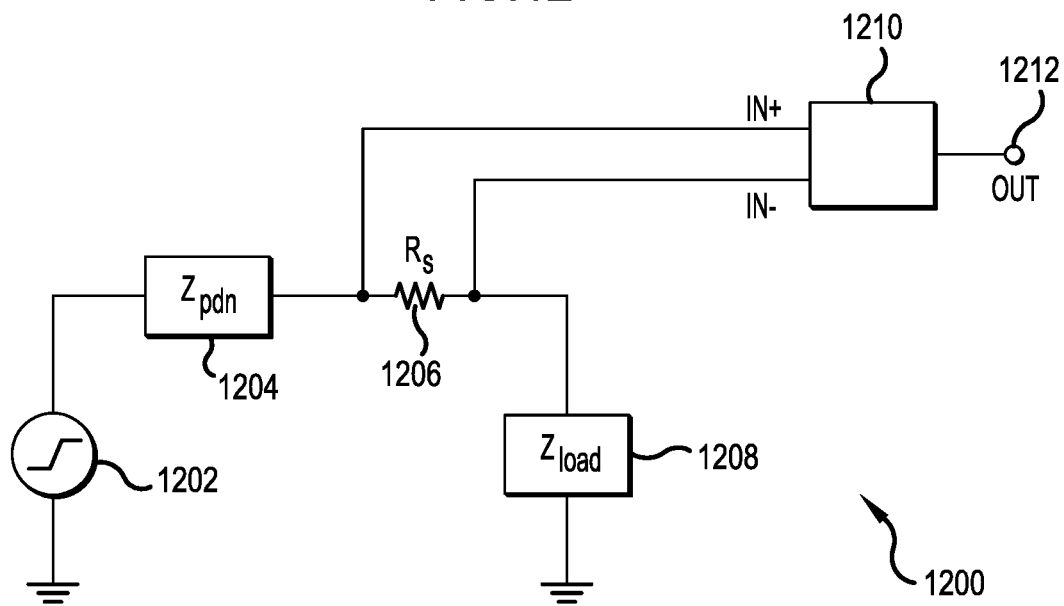
FIG. 12 illustrates an exemplary system that has a single wideband amplifier configured to evaluate output current characteristics of a signal source in accordance with an embodiment of the disclosure.

FIG. 12 illustrates an exemplary system 1200 configured to evaluate output current characteristics of a signal source 1202 in accordance with an embodiment of the disclosure. The exemplary system 1200, which is a variant of the system 500 described above with reference to FIG. 5, is used here to describe certain aspects pertaining to signal distortion and overdrive conditions. In contrast to the system 500 that includes a first wideband amplifier 510 and a second wideband amplifier 512, the exemplary system 1200 has a single wideband amplifier 1210. The wideband amplifier 1210 includes the DC differential amplifier 130, the AC differential amplifier 110, and the signal combiner circuit 140 as shown in FIG. 1. In this exemplary embodiment, each of the DC differential amplifier 130 and the AC differential amplifier 110 is selected to accommodate an input voltage swing ranging from about +0.5V to about −0.5V.

Figure 13A:
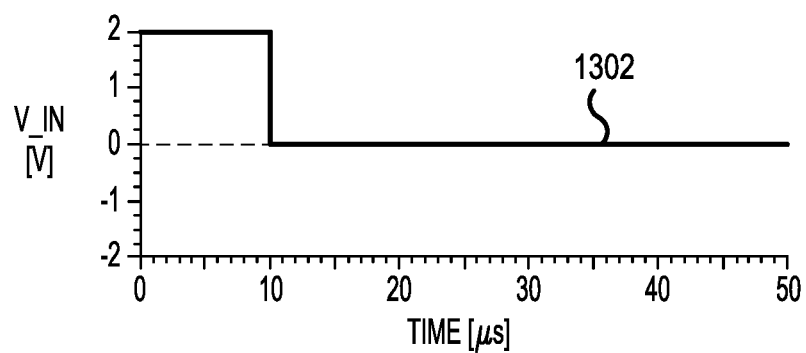
FIGS. 13A-13D illustrate some exemplary waveforms associated with the system shown in FIG. 12.

FIG. 13A illustrates an exemplary input waveform 1302 that corresponds to an input signal coupled into the first input node 102 and the second input node 104 of the wideband amplifier 100 from across the resistor 506. The input signal ranges from about +2V to about 0V.

Figure 13B:
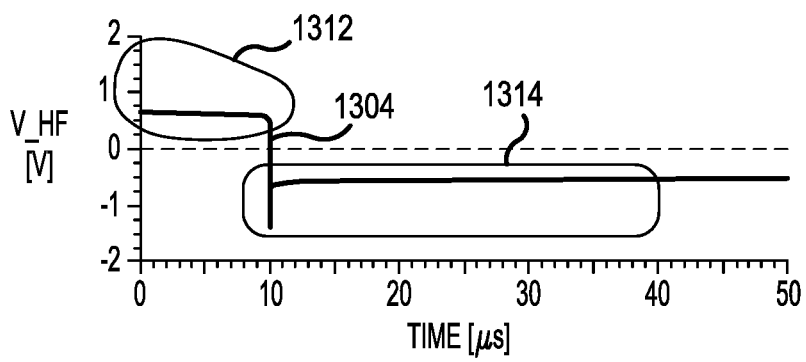

FIG. 13B illustrates an exemplary waveform 1304 that is present at the output terminal 141 of the AC differential amplifier 110 when the input signal is coupled into the wideband amplifier 100. The first series input capacitor 116 and the second series input capacitor 118 of the AC differential amplifier 110 configures the AC differential amplifier 110 as an AC amplifier. Consequently, the waveform 1304 shows a first portion 1312 (corresponding to the 2V portion of the input waveform 1302) above 0V (at about +0.5V) and a second portion 1314 (corresponding to the 0V portion of the input waveform 1302) below 0V (at about −0.5V). The first portion 1312 is indicative of an overdrive condition that leads to an undershoot in the second portion 1314. The peak-to-peak amplitude of the waveform 1304 is about 1V as result of voltage clipping in the AC differential amplifier 110 due to the limited operating range (from about +0.5V to about −0.5V).

Figure 13C:
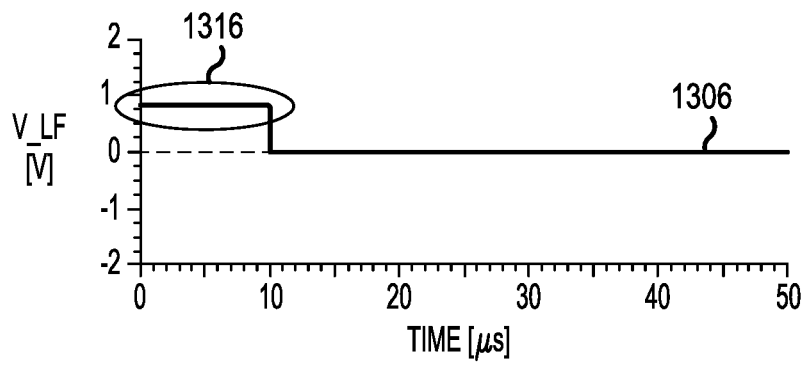

FIG. 13C illustrates an exemplary waveform 1306 that is present at the output terminal 139 of the DC differential amplifier 130 when the input signal is coupled into the wideband amplifier 100. The waveform 1306 shows a first portion 1316 (corresponding to the 2V portion of the input waveform 1302) above 0V (at about +0.5V). The remaining portion of the waveform 1306 accurately reflects the 0V condition present in the input signal. The first portion 1316 occurs as a result of voltage clipping in the DC differential amplifier 130 due to the limited operating range (from about +0.5V to about −0.5V).

Figure 13D:
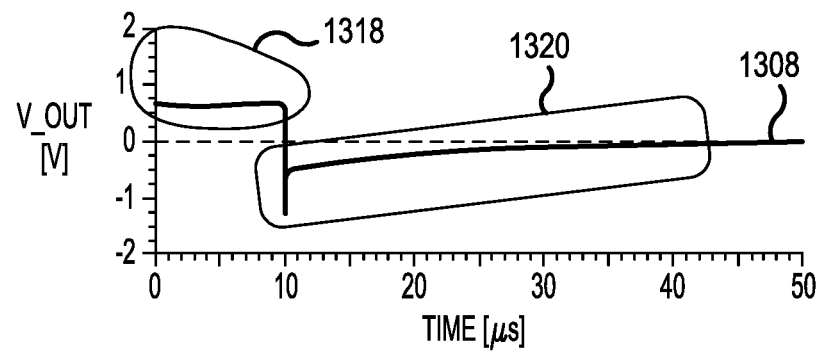

FIG. 13D illustrates an exemplary output waveform 1308 that is present at the output node 1212 of the wideband amplifier 1210 when the wideband amplifier 1210 is operating in the wideband operational configuration and the signal combiner circuit 140 has combined the waveform 1304 with the waveform 1306. The output waveform 1308 includes waveform distortion as indicated by the portion 1318 (corresponding to the first portion 1312 of the waveform 1304) and the portion 1320 (corresponding to the second portion 1314 of the waveform 1304). The portion 1320 also includes the undershoot due to the overdrive condition.

The signal distortion and overdrive condition indicated by the waveform 1308 can be mitigated by placing the wideband amplifier 1210 in the low-pass operational configuration in accordance with the disclosure. In the low-pass operational configuration a control signal is provided to the control terminal 114 of the AC differential amplifier 110 to place the AC differential amplifier 110 in the high impedance output condition. Consequently, the signal combiner circuit 140 includes only the low-pass filter that provides a bandwidth ranging from DC to the upper cut-off frequency ($f_2$) that is shown in FIG. 2.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A wideband amplifier comprising:
a direct-current (DC) differential amplifier configured to provide a first frequency response extending from DC to a first cut-off frequency when the wideband amplifier is placed in a first operational configuration, and extending from DC to a second cut-off frequency that is higher than the first cut-off frequency when the wideband amplifier is placed in a second operational configuration;
an alternating-current (AC) differential amplifier configured to provide a second frequency response extending from the first cut-off frequency to a third cut-off frequency when the wideband amplifier is placed in the first operational configuration, and extending from a fourth cut-off frequency that is lower than the first cut-off frequency, to the third cut-off frequency when the wideband amplifier is placed in a third operational configuration; and
a signal combiner circuit configured to combine a first output signal of the DC differential amplifier and a second output signal of the AC differential amplifier, the signal combiner circuit comprising a low-pass filter connected to an output terminal of the DC differential amplifier and a high-pass filter connected to an output terminal of the AC differential amplifier.

2. The wideband amplifier of claim 1, wherein the low-pass filter comprises an output resistor connected to the output terminal of the DC differential amplifier and the high-pass filter comprises a capacitor connected to the output terminal of the AC differential amplifier.

3. The wideband amplifier of claim 1, wherein the AC differential amplifier includes a first control terminal configured to receive a first control signal for placing the AC differential amplifier in a high impedance output condition as a part of the second operational configuration of the wideband amplifier, and wherein the DC differential amplifier includes a second control terminal configured to receive a second control signal for placing the DC differential amplifier in the high impedance output condition as a part of the third operational configuration of the wideband amplifier.

4. The wideband amplifier of claim 1, wherein the DC differential amplifier comprises an output resistor having a first lead connected to the output terminal of the DC differential amplifier, and wherein the AC differential amplifier comprises an output capacitor having a first lead connected to the output terminal of the AC differential amplifier.

5. The wideband amplifier of claim 4, further comprising:
a first switch connected between a second lead of the output capacitor and an output node of the wideband amplifier, the first switch operable to place the wideband amplifier in the second operational configuration; and
a second switch connected between a second lead of the output resistor and the output node of the wideband amplifier, the second switch operable to place the wideband amplifier in the third operational configuration.

6. The wideband amplifier of claim 1, further comprising:
a first switch connected between the output terminal of the AC differential amplifier and an output capacitor that is coupled to an output node of the wideband amplifier, the first switch operable to place the wideband amplifier in the second operational configuration; and
a second switch connected between the output terminal of the DC differential amplifier and an output resistor that is coupled to the output node of the wideband amplifier, the second switch operable to place the wideband amplifier in the third operational configuration.

7. The wideband amplifier of claim 1, further comprising:
a first switch connected across a first series input capacitor of the AC differential amplifier; and
a second switch connected across a second series input capacitor of the AC differential amplifier.

8. A wideband amplifier comprising:
a first input node;
a second input node;
an output node;
a direct-current (DC) differential amplifier having a first input terminal, a second input terminal, and a first output terminal, the first input terminal connected to the first input node of the wideband amplifier, the second input terminal connected to the second input node of the wideband amplifier;
an output resistor having a first lead connected to the first output terminal of the DC differential amplifier;
an alternating-current (AC) differential amplifier having a third input terminal, a fourth input terminal, and a second output terminal;
a first series input capacitor having a first lead connected to the first input node of the wideband amplifier and a second lead connected to the third input terminal of the AC differential amplifier;
a second series input capacitor having a first lead connected to the second input node of the wideband amplifier and a second lead connected to the fourth input terminal of the AC differential amplifier; and
an output capacitor having a first lead connected to the second output terminal of the AC differential amplifier, wherein the DC differential amplifier includes a first control terminal configured to receive a first control signal for placing the DC differential amplifier in a high impedance output condition, and wherein the AC differential amplifier includes a second control terminal configured to receive a second control signal for placing the AC differential amplifier in the high impedance output condition.

9. The wideband amplifier of claim 8, wherein each of second lead of the output resistor and a second lead of the output capacitor is connected to the output node of the wideband amplifier.

10. The wideband amplifier of claim 8, wherein each of the output capacitor and the output resistor is a part of a signal combiner circuit, the signal combiner circuit configured to operate as a low-pass filter connected to the first output terminal of the DC differential amplifier and as a high-pass filter connected to the second output terminal of the AC differential amplifier.

11. The wideband amplifier of claim 8, wherein the DC differential amplifier provides a first frequency response extending from DC to a first cut-off frequency when the wideband amplifier is placed in a first operational configuration, and extending from DC to a second cut-off frequency that is higher than the first cut-off frequency when the wideband amplifier is placed in a second operational configuration, and wherein the AC differential amplifier provides a second frequency response extending from the first cut-off frequency to a third cut-off frequency when the wideband amplifier is placed in the first operational configuration, and extending from a fourth cut-off frequency that is lower than the first cut-off frequency, to the third cut-off frequency when the wideband amplifier is placed in a third operational configuration.

12. A method comprising:
placing a wideband amplifier in a first operational configuration during a first period of time whereby a DC differential amplifier provides a first frequency response extending from DC to a first cut-off frequency, and an AC differential amplifier provides a second frequency response extending from the first cut-off frequency to a third cut-off frequency;
placing the wideband amplifier in a second operational configuration during a second period of time whereby the first frequency response of the DC differential amplifier extends from DC to a second cut-off frequency that is higher than the first cut-off frequency; and
placing the wideband amplifier in a third operational configuration during a third period of time whereby the second frequency response of the AC differential amplifier extends from a fourth cut-off frequency that is lower than the first cut-off frequency, to the third cut-off frequency.

13. The method of claim 12, wherein placing the wideband amplifier in the first operational configuration during the first period of time comprises:
combining an output signal of the AC differential amplifier with an output signal of the DC differential amplifier in a signal combiner circuit, the signal combiner circuit comprising a low-pass filter connected to an output terminal of the DC differential amplifier and a high-pass filter connected to an output terminal of the AC differential amplifier.

14. The method of claim 12, wherein placing the wideband amplifier in the second operational configuration during the second period of time comprises:
placing the AC differential amplifier in a high impedance output condition to prevent combining an output signal of the AC differential amplifier with an output signal of the DC differential amplifier.

15. The method of claim 14, wherein placing the AC differential amplifier in the high impedance output condition comprises providing a control signal to a control terminal of the AC differential amplifier.

16. The method of claim 12, wherein placing the wideband amplifier in the third operational configuration during the third period of time comprises:
placing the DC differential amplifier in a high impedance output condition to prevent combining an output signal of the DC differential amplifier with an output signal of the AC differential amplifier.

17. The method of claim 16, wherein placing the DC differential amplifier in the high impedance output condition comprises providing a control signal to a control terminal of the DC differential amplifier.

18. The method of claim 12, wherein placing the wideband amplifier in the second operational configuration during the second period of time comprises:
activating a first switch to disconnect an output terminal of the DC differential amplifier from a low-pass filter that is connected between the output terminal of the DC differential amplifier and an output node of the wideband amplifier.

19. The method of claim 12, wherein placing the wideband amplifier in the third operational configuration during the third period of time comprises:
activating a first switch to disconnect an output terminal of the AC differential amplifier from a high-pass filter that is connected between the output terminal of the AC differential amplifier and an output node of the wideband amplifier.

\* \* \* \* \*